United States Patent
Khakifirooz et al.

(10) Patent No.: US 8,648,388 B2
(45) Date of Patent: Feb. 11, 2014

(54) HIGH PERFORMANCE MULTI-FINGER STRAINED SILICON GERMANIUM CHANNEL PFET AND METHOD OF FABRICATION

(75) Inventors: Ali Khakifirooz, San Jose, CA (US);
Thomas N. Adam, Albany, NY (US);
Kangguo Cheng, Albany, NY (US);
Alexander Reznicek, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 10 days.

(21) Appl. No.: 13/396,970

(22) Filed: Feb. 15, 2012

(65) Prior Publication Data
US 2013/0207162 A1 Aug. 15, 2013

(51) Int. Cl.
*H01L 21/336* (2006.01)
(52) U.S. Cl.
USPC .......................................................... 257/192
(58) Field of Classification Search
None
See application file for complete search history.

(56) References Cited

U.S. PATENT DOCUMENTS

| | | | |
|---|---|---|---|
| 7,098,057 B2 | 8/2006 | Chu et al. | |
| 7,691,708 B2 | 4/2010 | Jones et al. | |
| 7,704,815 B2 | 4/2010 | Chu et al. | |
| 7,741,169 B2 | 6/2010 | Lu et al. | |
| 7,939,413 B2 * | 5/2011 | Chong et al. | 438/300 |
| 8,299,453 B2 * | 10/2012 | Zhu | 257/19 |
| 8,354,694 B2 * | 1/2013 | Bedell et al. | 257/192 |
| 2006/0081836 A1 | 4/2006 | Kimura et al. | |
| 2008/0169484 A1 | 7/2008 | Chuang et al. | |
| 2009/0236632 A1 | 9/2009 | Anderson et al. | |
| 2009/0294801 A1 | 12/2009 | Harley et al. | |
| 2011/0068369 A1 | 3/2011 | Cheng et al. | |
| 2011/0147793 A1 | 6/2011 | Chiu et al. | |

FOREIGN PATENT DOCUMENTS

| | | |
|---|---|---|
| KR | 10-2005-106432 A | 11/2005 |
| KR | 10-2006-045451 A | 5/2006 |

OTHER PUBLICATIONS

Mochizuki et al.; Strain Relaxation of Patterned Ge and SiGe Layers on Si(OO1) Substrates; SiGe Technology and Device Meeting, 2006. ISTDM 2006. Third International; pp. 1-2.
Buca et al.; Asymmetric Strain Relaxation in Patterned Ge and SiGe Layers: A Means to Enhance Carrier Mobilities in Si Cap Layers; Applied Physics Letters Issue Date: Jan. 2007 vol. 90 Issue: 3; pp. 032108-032108-3.

* cited by examiner

*Primary Examiner* — Thao P. Le
(74) *Attorney, Agent, or Firm* — Parashos Kalaitzis; Howard M Cohn

(57) ABSTRACT

A field effect transistor and method of fabrication are provided. The field effect transistor comprises a plurality of elongated uniaxially-strained SiGe regions disposed on a silicon substrate, oriented such that they are in parallel to the direction of flow of electrical carriers in the channel. The elongated uniaxially-strained SiGe regions are oriented perpendicular to, and traverse through the transistor gate.

24 Claims, 10 Drawing Sheets

HIGH PERFORMANCE MULTI-FINGER STRAINED SILICON GERMANIUM CHANNEL PFET AND METHOD OF FABRICATION

FIELD OF THE INVENTION

The present invention relates generally to semiconductor fabrication, and more particularly, to fabrication of field effect transistors.

BACKGROUND OF THE INVENTION

It is known that a significant performance boost is achieved in narrow strained silicon germanium (SiGe) channel PFETs. Unlike wide SiGe channel PFETs, where strain is biaxial, in narrow SiGe channel PFETs strain is mostly uniaxial, which is preferable to biaxial strain. For most logic applications multi-finger FETs are needed to achieve uniaxial strain, while providing the required total width needed to deliver the required drive current. Traditional multi-finger devices on bulk or silicon-on-insulator (SOI) comprise shallow trench isolation (STI) between the fingers that belong to a single device, which may increase the device footprint (size) to an undesirable level. As technology trends towards miniaturization and high performance, it is desirable to have a high performance multi-finger strained silicon germanium channel PFET and method of fabrication.

SUMMARY

In one embodiment, a field effect transistor is provided. The field effect transistor comprises a silicon substrate, a plurality of elongated uniaxially-strained SiGe regions disposed on the silicon substrate, a gate disposed on the silicon substrate and on the plurality of elongated SiGe regions, wherein the gate is oriented perpendicular to the SiGe regions, a channel region disposed below the gate, wherein electrical carriers flow through the channel, a source region disposed on a first side of the gate, a drain region disposed on a second side of the gate, wherein the plurality of elongated SiGe regions are oriented in parallel to the direction of flow of electrical carriers in the channel.

In another embodiment, a field effect transistor is provided. This field effect transistor comprises a silicon substrate, a gate disposed on the silicon substrate, a source region disposed on a first side of the gate, a drain region disposed on a second side of the gate, and a plurality of elongated uniaxially-strained SiGe regions disposed on the silicon substrate and oriented perpendicular to the gate, and wherein the plurality of elongated uniaxially-strained SiGe regions traverse the gate, a first shallow trench isolation region disposed on a first side of the plurality of elongated uniaxially-strained SiGe regions and a second shallow trench isolation region disposed on a second side of the plurality of elongated uniaxially-strained SiGe regions, a raised source disposed over the source region, and a raised drain disposed over the drain region.

In another embodiment, a field effect transistor is provided. This field effect transistor comprises a silicon substrate. The silicon substrate has a first threshold voltage. The field effect transistor further comprises a plurality of elongated uniaxially-strained fingers disposed on the silicon substrate, wherein the fingers have a second threshold voltage, and wherein the first threshold voltage is larger than the second threshold voltage. The field effect transistor further comprises a gate disposed on the silicon substrate and on the plurality of elongated fingers, wherein the gate is oriented perpendicular to the fingers regions, a channel region disposed below the gate, wherein electrical carriers flow through the channel region, a source region disposed on a first side of the gate, a drain region disposed on a second side of the gate, wherein the plurality of elongated fingers are oriented in parallel to the direction of flow of electrical carriers in the channel region.

In another embodiment a field effect transistor is provided. This field effect transistor comprises a silicon substrate, a gate disposed on the silicon substrate, a source region disposed on a first side of the gate, a drain region disposed on a second side of the gate, and a plurality of elongated uniaxially-strained SiGe regions disposed on the silicon substrate and oriented perpendicular to the gate, and wherein the plurality of elongated uniaxially-strained SiGe regions traverse the gate, a first shallow trench isolation region disposed on a first side of the plurality of elongated uniaxially-strained SiGe regions and a second shallow trench isolation region disposed on a second side of the plurality of elongated uniaxially-strained SiGe regions, a raised source disposed over the source region, and a raised drain disposed over the drain region, wherein the raised source and raised drain are comprised of single crystal silicon and doped with boron. In another embodiment, a method of forming a field effect transistor is provided. The method comprises forming isolation regions in a silicon substrate, growing a SiGe layer on the silicon substrate, forming a plurality of fingers from the SiGe layer, and forming a gate in a perpendicular orientation to the plurality of fingers.

In another embodiment, a design process is provided. The design process includes inputting a design file representing a circuit design structure embodied in a non-transitory computer-readable medium, which when executed by a computer, produces the circuit design structure comprising a field effect transistor, wherein the field effect transistor comprises a silicon substrate, a plurality of elongated uniaxially-strained SiGe regions disposed on the silicon substrate, a gate disposed on the silicon substrate and on the plurality of elongated SiGe regions, wherein the gate is oriented perpendicular to the SiGe regions, a channel region disposed below the gate, wherein electrical carriers flow through the channel, a source region disposed on a first side of the gate, a drain region disposed on a second side of the gate, wherein the plurality of elongated SiGe regions are oriented in parallel to the direction of flow of electrical carriers in the channel.

BRIEF DESCRIPTION OF THE DRAWINGS

The structure, operation, and advantages of the present invention will become further apparent upon consideration of the following description taken in conjunction with the accompanying figures (FIGs.). The figures are intended to be illustrative, not limiting.

Certain elements in some of the figures may be omitted, or illustrated not-to-scale, for illustrative clarity. The cross-sectional views may be in the form of "slices", or "near-sighted" cross-sectional views, omitting certain background lines which would otherwise be visible in a "true" cross-sectional view, for illustrative clarity.

Figure 1:
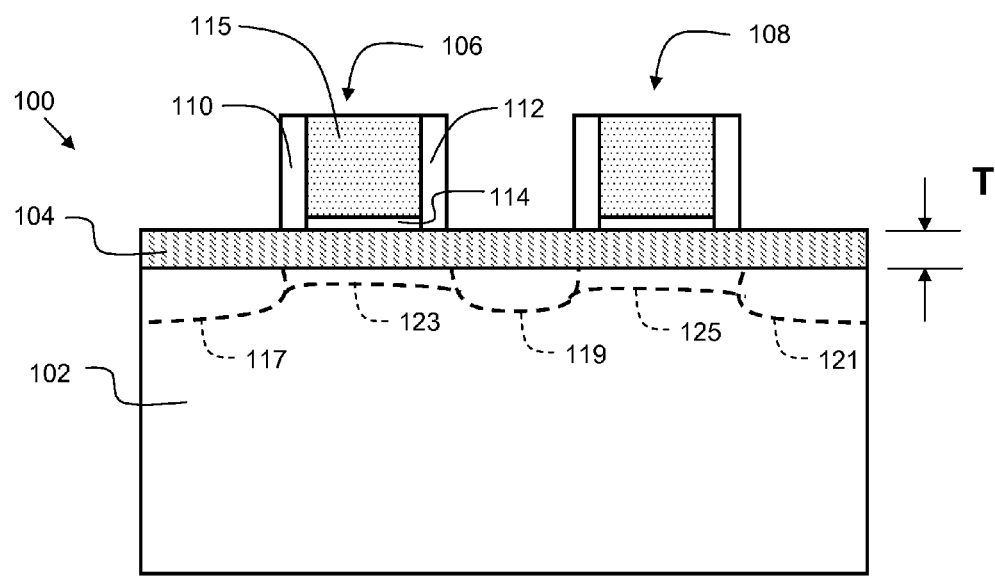

Often, similar elements may be referred to by similar numbers in various figures (FIGs) of the drawing, in which case typically the last two significant digits may be the same, the most significant digit being the number of the drawing figure (FIG). Furthermore, for clarity, some reference numbers may be omitted in certain drawings.

FIG. 1 is a side view of an embodiment of the present invention.

Figure 2:
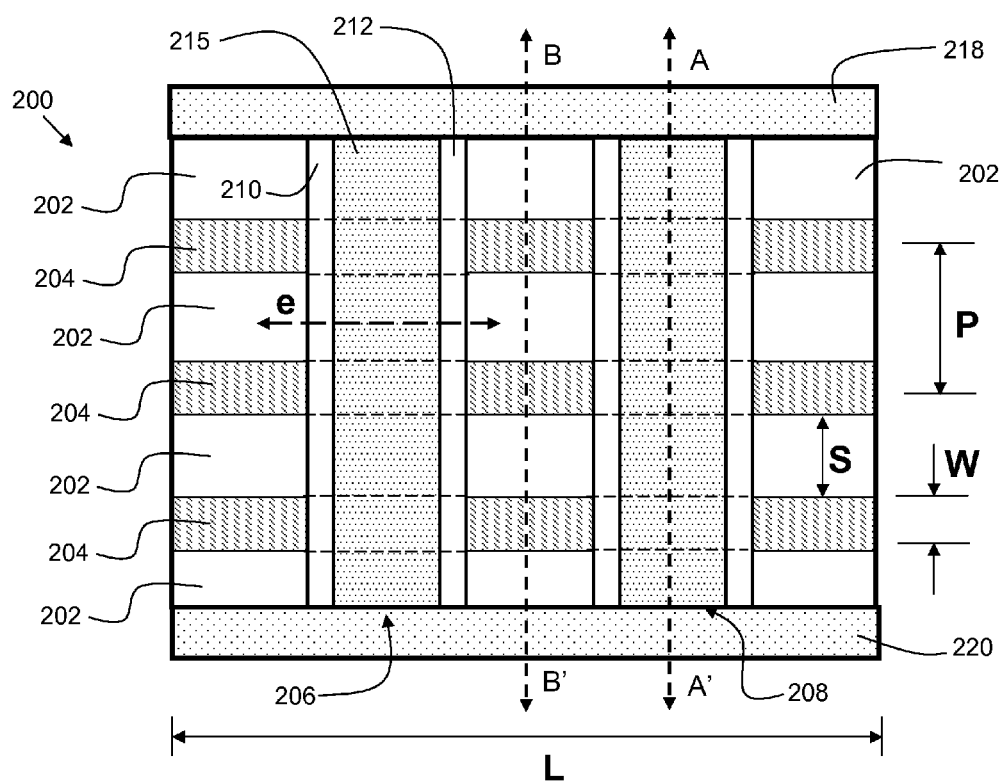

FIG. 2 is a top down view of the embodiment of FIG. 1.

Figure 3:
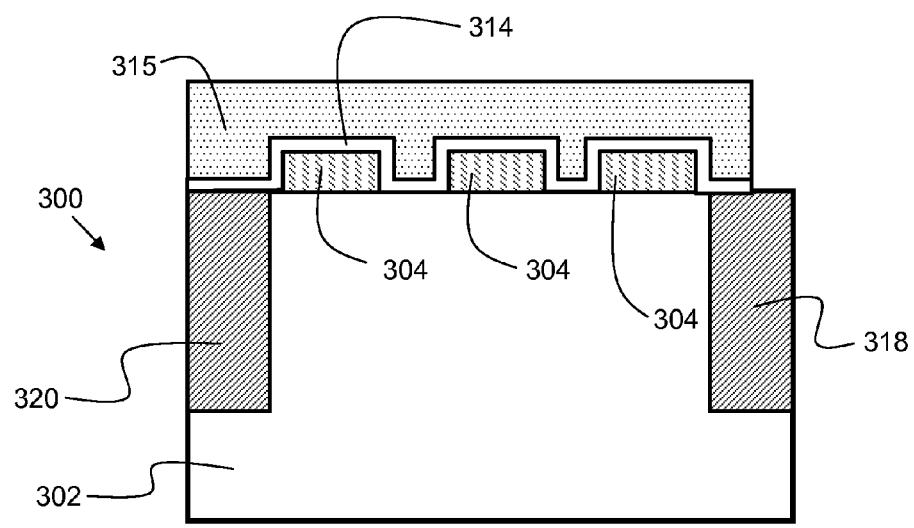

FIG. 3 is a cross section view of the embodiment of FIG. 2 as shown along line A-A'.

Figure 4:
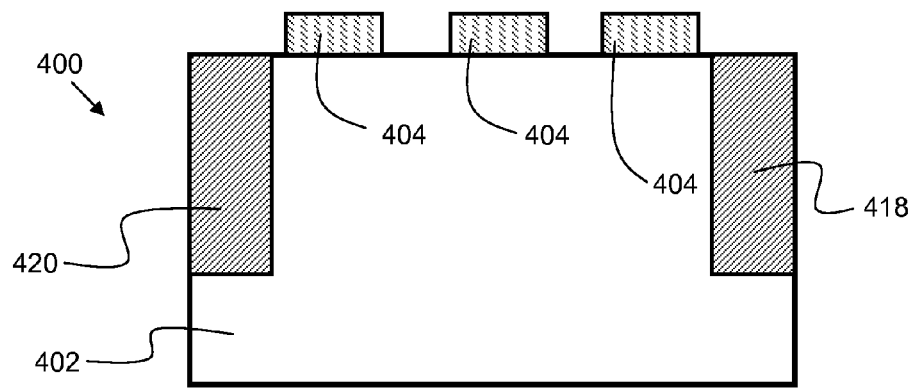

FIG. 4 is a cross section view of the embodiment of FIG. 2 as shown along line B-B'.

FIGS. 5-8 show process steps for a method in accordance with an embodiment of the present invention.

Figure 9:
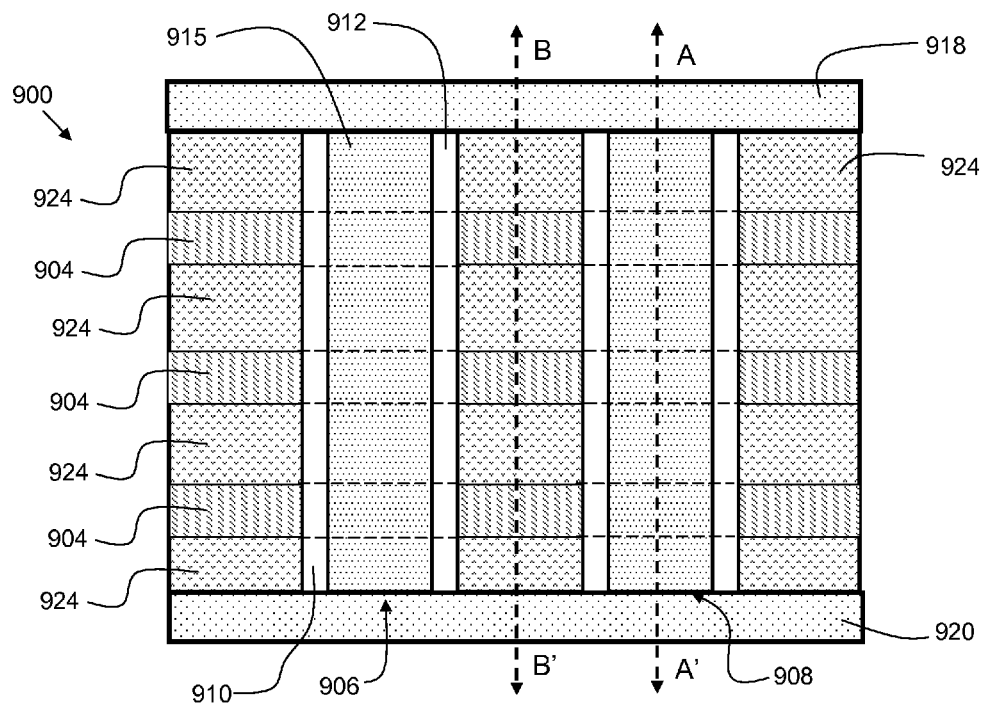

FIG. 9 is a top down view of an alternative embodiment having a raised source and drain.

Figure 10:
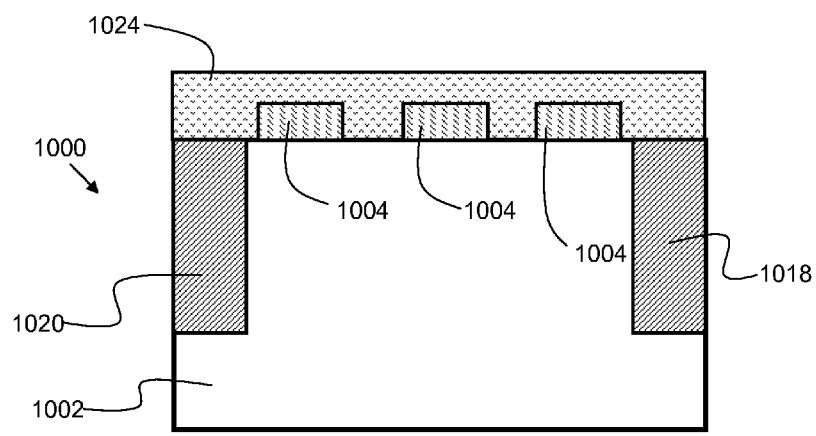

FIG. 10 is a cross section view of an alternative embodiment as shown along line B-B' of FIG. 9.

Figure 11:
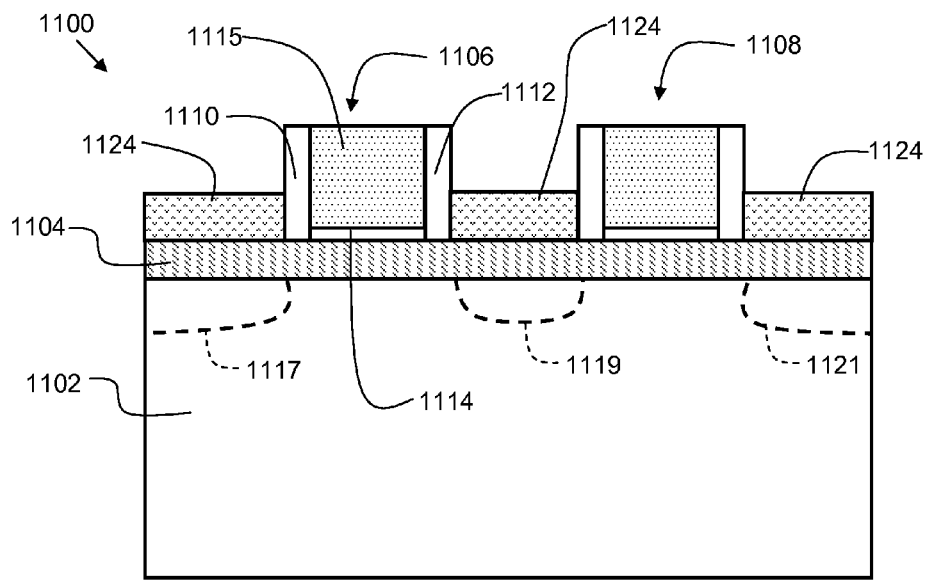

FIG. 11 is a side view of the embodiment of FIG. 9.

Figure 12:
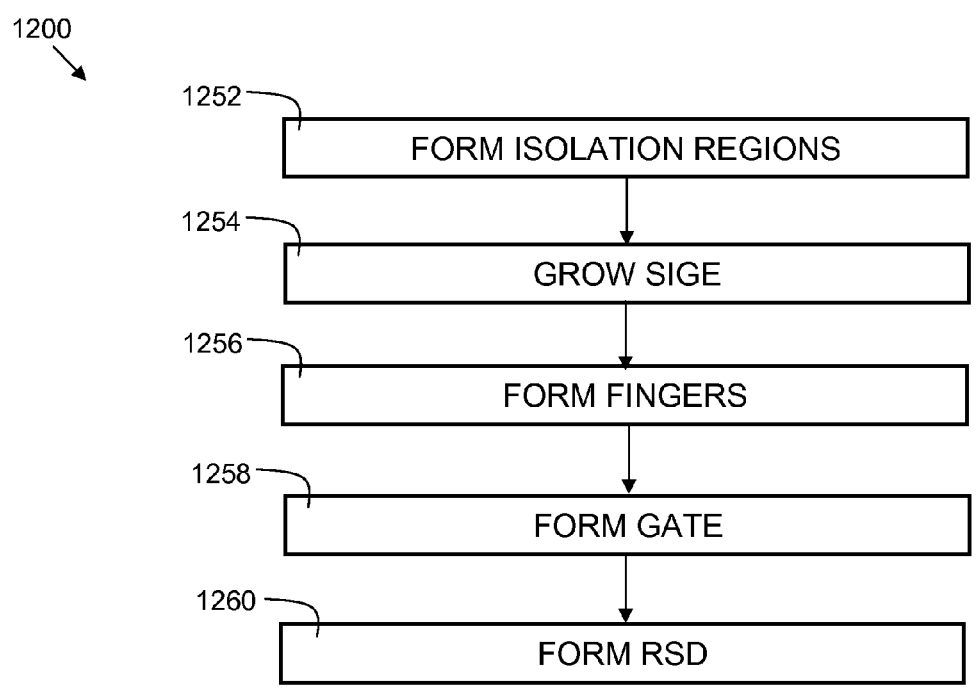

FIG. 12 is a flowchart indicating process steps for a method in accordance with an embodiment of the present invention.

Figure 13:
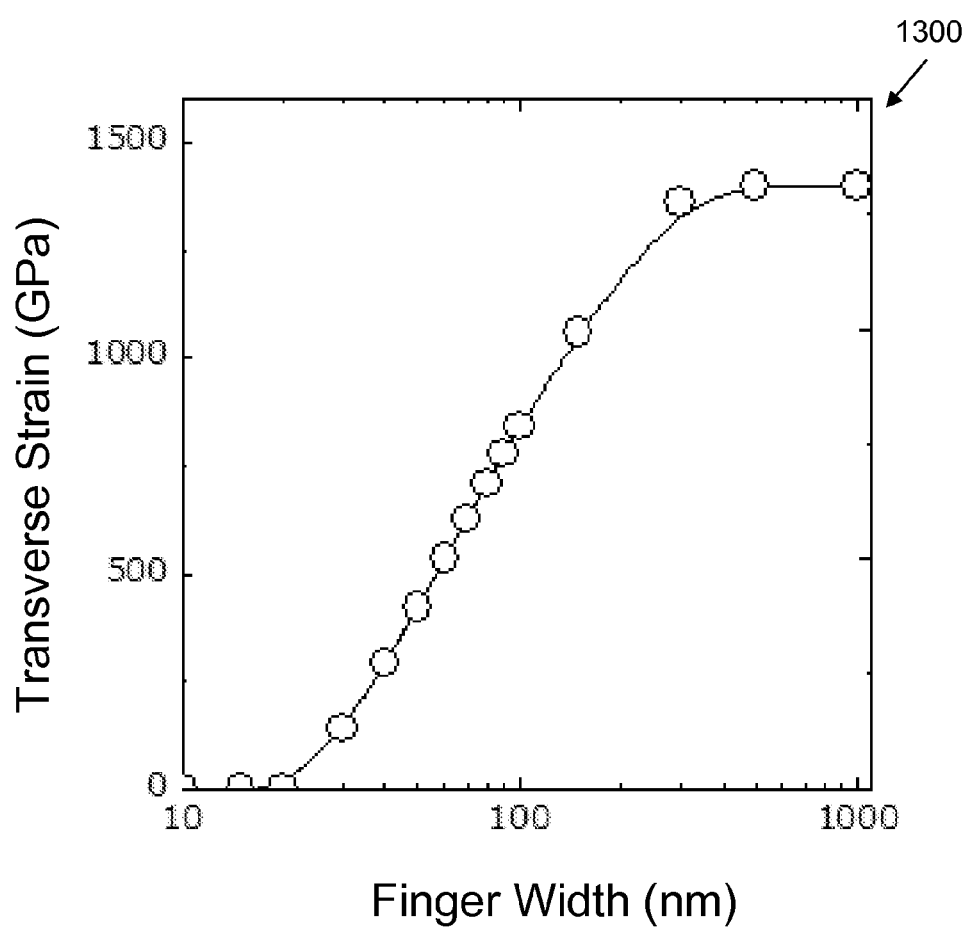

FIG. 13 is a chart indicating a relationship between transverse strain and finger width.

Figure 14:
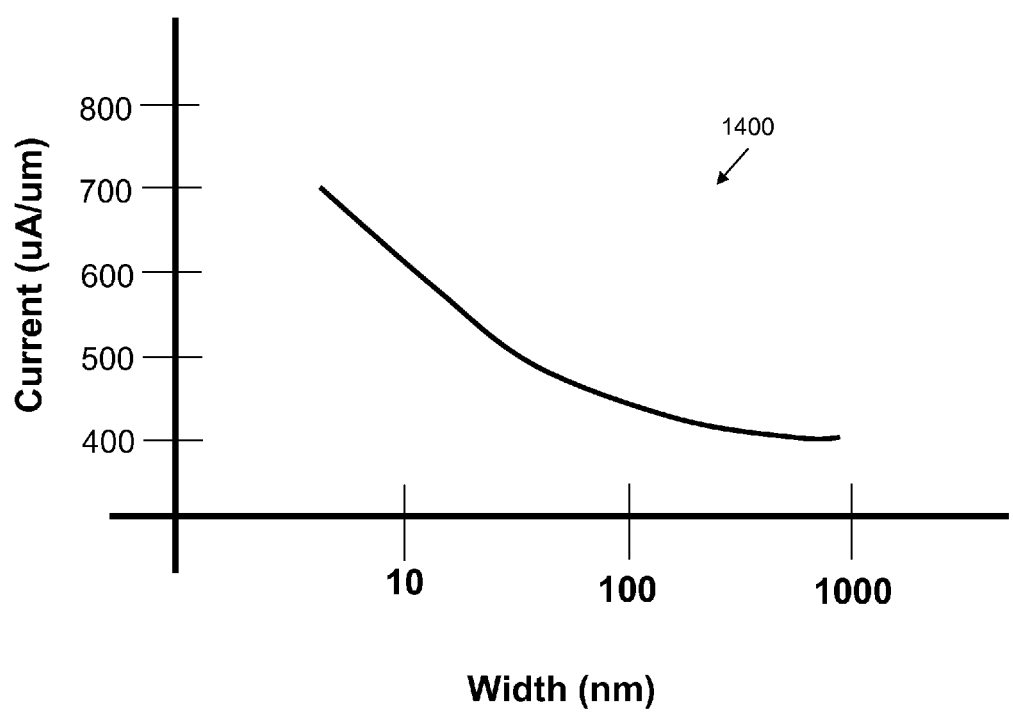

FIG. 14 is a chart indicating a relationship between drive current and finger width.

Figure 15:
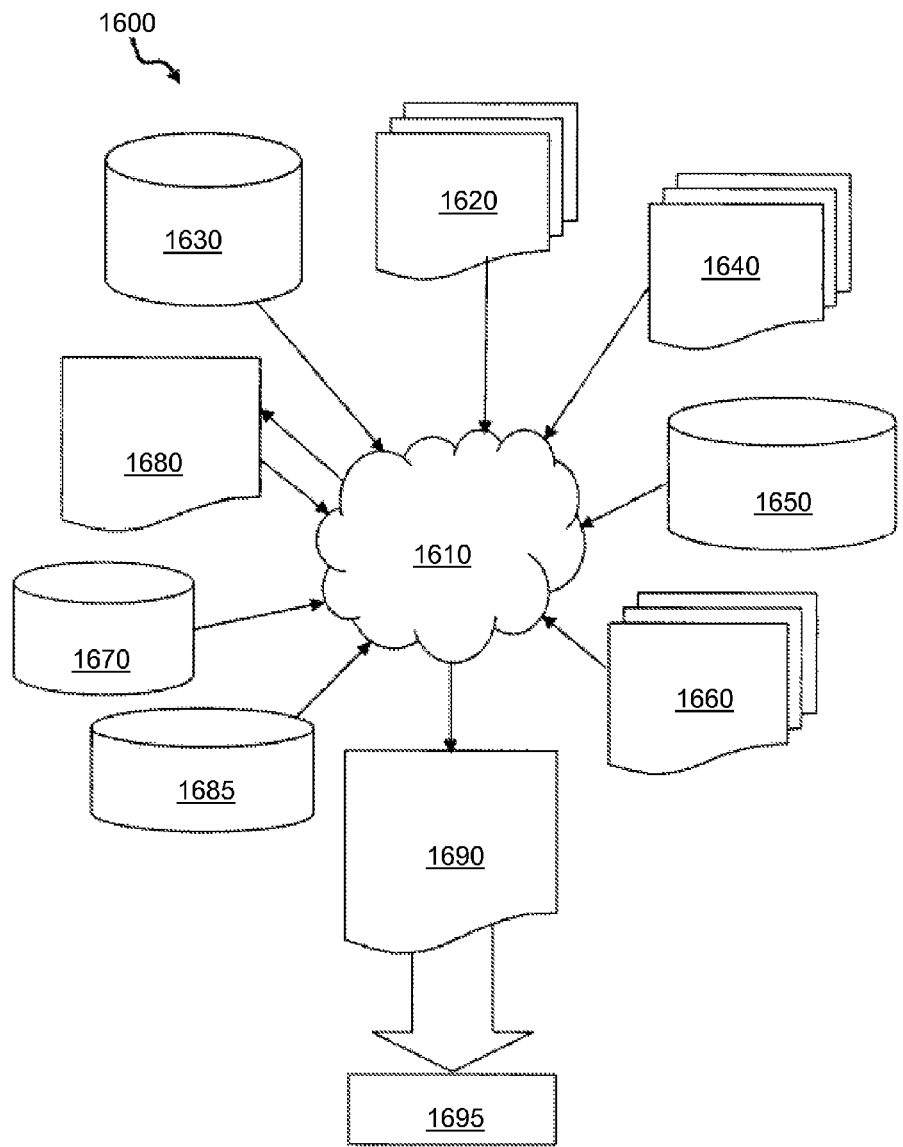

FIG. 15 shows a block diagram of an exemplary design flow.

DETAILED DESCRIPTION

Embodiments of the present invention provide a multi-finger strained SiGe-channel PFET transistor. The fingers are elongated regions of SiGe that may be formed by an etch process. Conventional shallow trench isolation (STI) is used to form isolation between different FETs or groups of FETs, but is not used in between the fingers of a particular FET. This approach saves area, thereby reducing the overall die area required for the PFET. Hence, the PFET has a reduced "footprint" as compared with prior art methods. A threshold voltage difference between fingers, which are comprised of SiGe, and the substrate, which is comprised of silicon, allows the omission of the STI in between the fingers because there will be negligible current leakage due to the higher threshold voltage of the silicon as compared with the SiGe fingers.

Furthermore, this approach also provides more area for an optional raised source/drain (RSD) and/or embedded stressor. In the space between the fingers, the gate is in contact with the silicon substrate. However, due to a significant threshold voltage difference between these substrate regions and the SiGe fingers (for example ~350-400 mV for typical SiGe channel and Si substrate) these regions will be in a depletion state and therefore have minimal contribution to the device leakage and capacitance. A significant increase in the transconductance (gm) of the narrow SiGe channels justifies the small area penalty incurred by the fingers.

FIG. 1 is a side view of a semiconductor structure 100 in accordance with an embodiment of the present invention. Semiconductor structure 100 comprises a silicon substrate 102. Disposed on silicon substrate 102 are elongated SiGe regions 104, which are referred to as "fingers." In one embodiment, the fingers 104 have a thickness T ranging from about 5 nanometers to about 25 nanometers. Transistors 106 and 108 are disposed on the fingers 104. Transistors 106 and 108 are P type field effect transistors (PFETs). The fingers 104 induce uniaxial strain that improves PFET carrier mobility. Transistor 106 is comprised of a gate 115 disposed on a thin layer of gate dielectric 114. Spacer 110 and spacer 112 are disposed adjacent to gate 115. Transistor 108 also has a gate, gate dielectric, and spacers arranged similar to that of transistor 106. However, for the sake of clarity, reference numbers are only shown for elements of transistor 106. Active areas 117, 119, and 121 are disposed in the substrate 102 adjacent to the gates of transistors 106 and 108. The active areas 117, 119, and 121 form source or drain regions of the adjacent transistors. Channel regions 123 and 125 are disposed below the gate of transistor 106 and 108 respectively.

FIG. 2 is a top down view of a semiconductor structure 200 which is similar to the embodiment of FIG. 1. In this view, a plurality of fingers 204 are visible. As stated previously, similar elements may be referred to by similar numbers in various figures of the drawing, in which case typically the last two significant digits may be the same, the most significant digit being the number of the drawing figure. For example, substrate 202 of FIG. 2 is similar to substrate 102 of FIG. 1. The gate dielectric is in contact with the fingers 204, and is also in contact with the substrate 202 in the areas in between the fingers 204. However, due to a significant threshold voltage difference between the substrate regions 202 and the SiGe fingers 204, the substrate regions 202 are in a depletion state and have minimal contribution to the device leakage and capacitance. In one embodiment, the threshold voltage difference between the substrate 202 and the fingers 204 is in the range of 350 to 400 mV.

Isolation regions 218 and 220 isolate transistor 206 and transistor 208 from other transistors. The isolation regions may be comprised of nitride, oxide, oxynitride, or other suitable material.

The fingers 204 are oriented perpendicular to the gate 215, and traverse the gate 215 of transistor 206. The fingers 204 are oriented in parallel to the direction of flow of electrical carriers (holes), which is indicated by arrow "e." The fingers are elongated, which causes them to produce uniaxial strain, which is more efficient in improving carrier mobility than biaxial strain. In one embodiment, the ratio of the length L of a finger 204 to its width W ranges from 10 to 40. In one embodiment, the length L of a finger 204 ranges from about 0.5 micrometer to about 3 micrometers and the width W of a finger 204 ranges from about 30 nanometers to about 80 nanometers, although lesser or greater values can be used. Each finger is spaced apart with a spacing of distance S. In one embodiment, the spacing S ranges from about 10 nanometers to about 40 nanometers. The pitch P, which is the distance between midpoints of neighboring fingers, may in some embodiments, be in the range of about 50 nanometers to about 100 nanometers, although lesser or greater values can be used.

Note that due to the previously mentioned threshold voltage difference between the fingers and the silicon substrate, no isolation region is present in between the plurality of elongated uniaxially-strained SiGe fingers 204, which serves to reduce the space required for a PFET since the fingers 204 may be placed closer together. Because of the threshold voltage difference, the performance of the PFET is determined by the SiGe fingers 204 and the silicon in between the fingers does not significantly contribute to the off current or drive current because it has a much higher threshold voltage.

FIG. 3 is a cross section view of a semiconductor structure 300 which is similar to the embodiment of FIG. 2, as shown along line A-A'. In this view, three fingers 304 are visible, disposed on silicon substrate 302 in between isolation regions 318 and 320. A gate dielectric 314 is disposed on the fingers 304 and also disposed on the substrate 302 in areas in between the fingers 304. The gate 315 is disposed on the gate dielectric 314. In one embodiment, the gate dielectric 314 is comprised of hafnium oxide, hafnium silicate, aluminum oxide, or a combination of these materials. In one embodiment, the gate 315 is comprised of a material such as titanium nitride, tantalum nitride, titanium aluminum nitride, tantalum aluminum nitride, tantalum carbide, tungsten, tungsten nitride, or a combination thereof. The choice of gate material determines the gate workfunction, which in turn affects the threshold voltage. Hence, the aforementioned gate materials may be referred to as "workfunction adjusting metals."

A polysilicon layer is optionally present on the workfunction adjusting metal and can be partially or fully silicided. A replacement metal gate process may also be used with embodiments of the present invention. Hence, other materials for gate 315 are possible, including, but not limited to, aluminum, tungsten, tungsten nitride, titanium nitride (TiN), or ruthenium (Ru). Note that while three fingers are shown in FIG. 3, more or fewer fingers may be used. The number of fingers used depends on the desired design and design constraints. For example, the desired device width may be a factor in determining how many fingers can fit in between the isolation regions. In one embodiment, three to eight fingers may be used.

FIG. 4 is a cross section view of a semiconductor structure 400 which is similar to the embodiment of FIG. 2, as shown along line B-B'. In this view, three fingers 404 are visible, disposed on silicon substrate 402 in between isolation regions 418 and 420.

Figure 5:
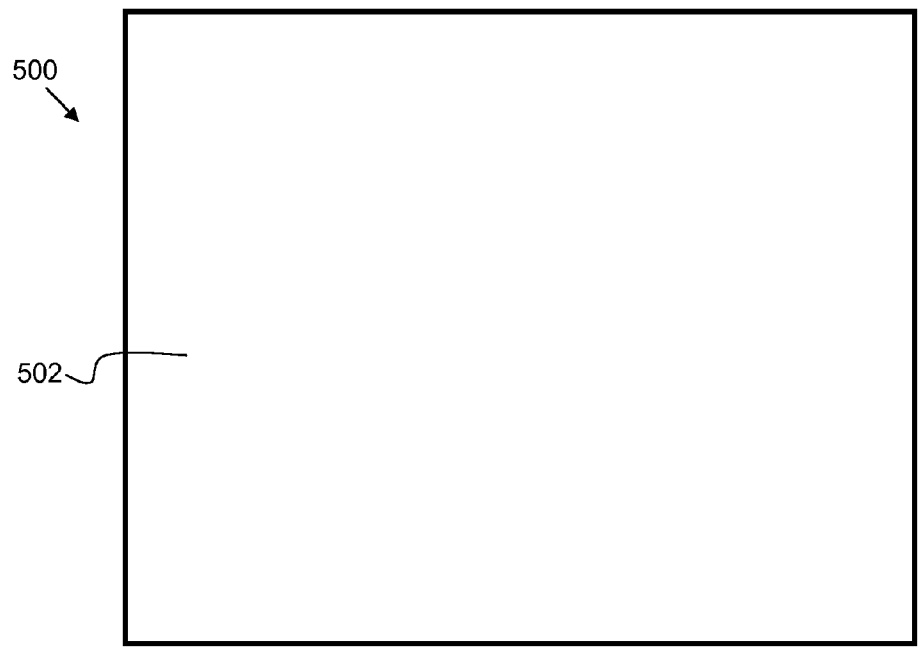

FIG. 5 is a top down view showing a semiconductor structure 500 at a starting point for a method in accordance with an embodiment of the present invention. Semiconductor structure 500 is comprised of silicon substrate 502.

Figure 6:
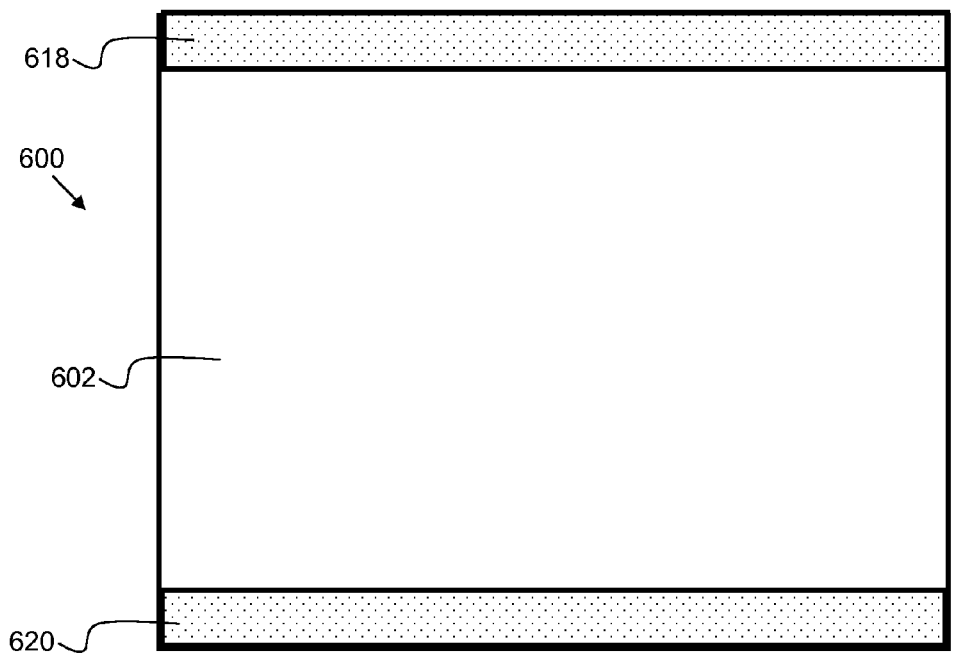

FIG. 6 is a top down view showing a semiconductor structure 600 after a subsequent process step of forming isolation regions 618 and 620. Isolation regions 618 and 620 may be standard shallow trench isolation (STI) regions as is known in the art. Isolation regions 618 and 620 may be formed by etching cavities in the substrate 602, and then depositing an insulating material such as oxide, nitride, or oxynitride in the cavities, followed by chemical mechanical polishing (CMP).

Figure 7:
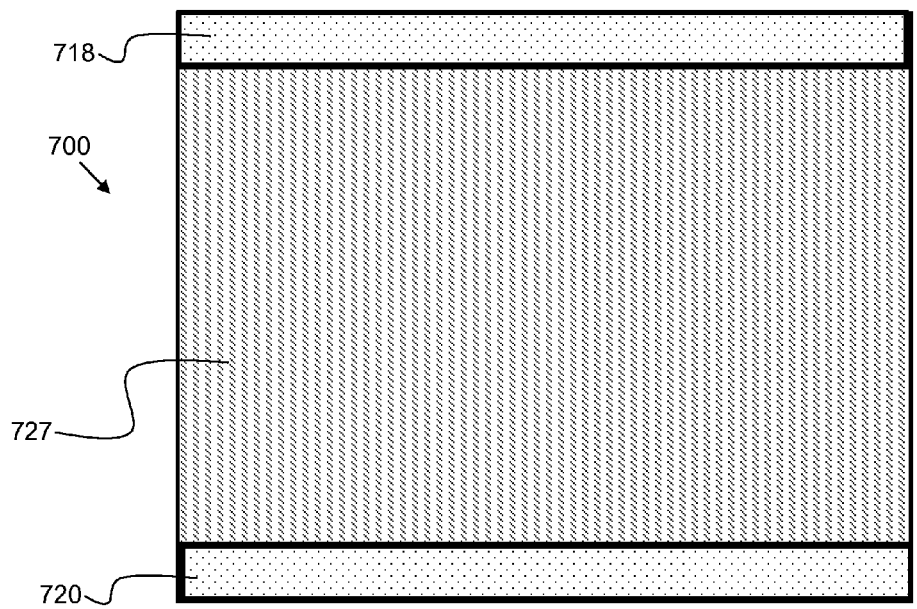

FIG. 7 is a top down view showing a semiconductor structure 700 after a subsequent process step of growing a layer of silicon germanium (SiGe) 727. In one embodiment, the SiGe layer 727 has a germanium concentration ranging from about 20 atomic percent to about 40 atomic percent. The SiGe layer (727) can be grown epitaxially on the silicon substrate for example by a low-pressure chemical vapor deposition (LPCVD) or ultra-high vacuum chemical vapor deposition (UHVCVD) method. The SiGe layer (727) is lattice matched to the underlying Si substrate and as a result is under biaxial compressive strain. The strain is converted to uniaxial compressive strain, once the SiGe is cut into fingers by a mechanism known as edge relaxation.

Figure 8:
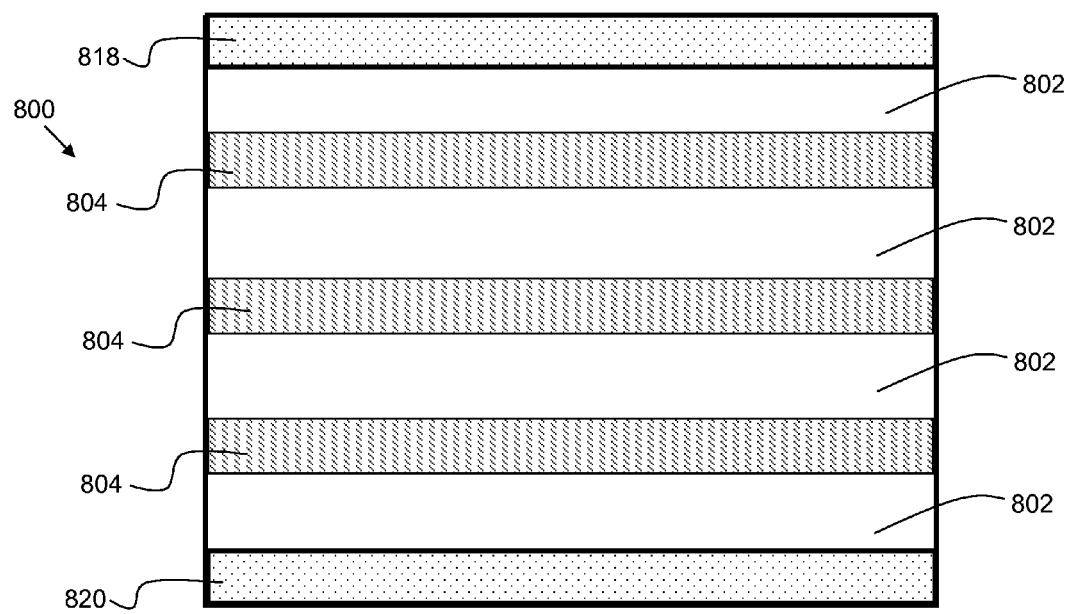

FIG. 8 is a top down view showing a semiconductor structure 800 after a subsequent process step of forming SiGe fingers 804. This is done by removing portions of the SiGe layer (727 of FIG. 7) to expose portions of the silicon substrate 802. The removing of portions of the SiGe layer may be performed with industry standard lithographic and/or etching methods. In another embodiment, a sidewall image transfer (SIT) technique may be used to form the fingers 804. The sidewall image transfer process is well known, and is the subject of U.S. Pat. No. 5,795,830 to Cronin, et al, which is incorporated herein by reference.

After the fingers 804 are formed, transistor gates and associated dielectric films and spacers are formed, resulting in a semiconductor structure similar to semiconductor structure 200 of FIG. 2.

FIG. 9 is a top down view of a semiconductor structure 900 in accordance with an alternative embodiment having a raised source and drain (RSD). The semiconductor structure 900 is similar to semiconductor structure 200 of FIG. 2, except that RSD material 924 is disposed over the silicon substrate. The RSD material may be comprised of single crystal Si or SiGe, and may optionally be doped with a p-type dopant such as boron. The RSD structure can be formed by an epitaxy method such as low-pressure chemical vapor deposition (LPCVD) epitaxy or ultra-high vacuum chemical vapor deposition (UHCVD) epitaxy. The RSD embodiment has various advantages, including reducing parasitic resistance.

FIG. 10 is a cross section view of a semiconductor structure 1000 which is similar to the embodiment of FIG. 9, as shown along line B-B'. In this view, three fingers 1004 are visible, disposed on silicon substrate 1002 in between isolation regions 1018 and 1020. RSD material 1024 is disposed on the fingers 1004, and also on the substrate 1002 in the areas in between fingers 1004. Note that the cross section view along line A-A' of FIG. 9 is similar to that of semiconductor structure 300 of FIG. 3.

FIG. 11 is a side view of a semiconductor structure 1100 which is similar to the embodiment of FIG. 9. In this view, it can be seen that RSD material 1124 is disposed over fingers 1104 and is adjacent to the gate 1115 of transistor 1106, and similarly, is adjacent to the gate of transistor 1108.

FIG. 12 is a flowchart indicating process steps for a method in accordance with an embodiment of the present invention. In process step 1252, isolation regions are formed in a silicon substrate (see 618 and 620 of FIG. 6). In process step 1254, a silicon germanium (SiGe) layer is grown on a silicon substrate (see 700 of FIG. 7). In process step 1256, SiGe fingers are formed for inducing uniaxial strain (see 804 of FIG. 8). The SiGe fingers are formed by removing portions of the SiGe layer grown in process step 1254. In process step 1258 a gate is formed, as well as gate dielectric and gate sidewall spacers (see 106 of FIG. 1). Optionally, process step 1260 may be performed to form raised source and raised drain regions (see 1124 of FIG. 11).

FIG. 13 is a chart 1300 indicating a relationship between transverse strain and finger width of a transistor in accordance with embodiments of the present invention. A wide finger possesses biaxial strain, which has a transverse component and a longitudinal component. The transverse component is undesirable as it inhibits carrier mobility. As shown in chart 1300, the transverse strain significantly decreases when the finger width falls below 50 nanometers. This property makes it desirable to have narrow fingers, as to reduce the transverse strain as much as possible.

FIG. 14 is a chart 1400 indicating a relationship between drive current and finger width of a transistor in accordance with embodiments of the present invention. As can be seen in chart 1400, the drive current increases significantly as the width of the fingers approaches 10 nanometers. This is because narrow fingers reduce the undesirable transverse strain, thereby increasing carrier mobility, which in turn increases drive current, hence creating a transistor with improved performance characteristics.

FIG. 15 shows a block diagram of an exemplary design flow 1600 used for example, in semiconductor IC logic design, simulation, test, layout, and manufacture. Design flow 1600 includes processes, machines and/or mechanisms for processing design structures or devices to generate logically or otherwise functionally equivalent representations of the design structures and/or devices described above and shown in FIGS. 1-12. The design structures processed and/or generated by design flow 1600 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 1600 may vary depending on the type of representation being designed. For example, a design flow 1600 for building an application specific IC (ASIC) may differ from a design flow 1600 for designing a standard component or from a design flow 1600 for instantiating the design into a programmable array, for example a programmable gate array (PGA) or a field programmable gate array (FPGA) offered by Altera® Inc. or Xilinx® Inc.

FIG. 15 illustrates multiple such design structures including an input design structure 1620 that is preferably processed by a design process 1610. Design structure 1620 may be a logical simulation design structure generated and processed by design process 1610 to produce a logically equivalent functional representation of a hardware device. Design structure 1620 may also or alternatively comprise data and/or program instructions that when processed by design process 1610, generate a functional representation of the physical structure of a hardware device. Whether representing functional and/or structural design features, design structure 1620 may be generated using electronic computer-aided design (ECAD) such as implemented by a core developer/designer. When encoded on a machine-readable data transmission, gate array, or storage medium, design structure 1620 may be accessed and processed by one or more hardware and/or software modules within design process 1610 to simulate or otherwise functionally represent an electronic component, circuit, electronic or logic module, apparatus, device, or system such as those shown in FIGS. 1-12. As such, design structure 1620 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 1610 preferably employs and incorporates hardware and/or software modules for synthesizing, translating, or otherwise processing a design/simulation functional equivalent of the components, circuits, devices, or logic structures shown in FIGS. 1-12 to generate a Netlist 1680 which may contain design structures such as design structure 1620. Netlist 1680 may comprise, for example, compiled or otherwise processed data structures representing a list of wires, discrete components, logic gates, control circuits, I/O devices, models, etc. that describes the connections to other elements and circuits in an integrated circuit design. Netlist 1680 may be synthesized using an iterative process in which Netlist 1680 is resynthesized one or more times depending on design specifications and parameters for the device. As with other design structure types described herein, Netlist 1680 may be recorded on a machine-readable data storage medium or programmed into a programmable gate array. The medium may be a non-transitory, non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 1610 may include using a variety of inputs; for example, inputs from library elements 1630 which may house a set of commonly used elements, circuits, and devices, including models, layouts, and symbolic representations, for a given manufacturing technology (e.g., different technology nodes, 32 nm, 45 nm, 90 nm, etc.), design specifications 1640, characterization data 1650, verification data 1660, design rules 1670, and test data files 1685 (which may include test patterns and other testing information). Design process 1610 may further include, for example, standard circuit design processes such as timing analysis, verification, design rule checking, place and route operations, etc. One of ordinary skill in the art of integrated circuit design can appreciate the extent of possible electronic design automation tools and applications used in design process 1610 without deviating from the scope and spirit of the invention. The design structure of the invention is not limited to any specific design flow.

Design process 1610 preferably translates an embodiment of the invention as shown in FIGS. 1-12, along with any additional integrated circuit design or data (if applicable), into a second design structure 1690. Design structure 1690 resides on a storage medium in a data format used for the exchange of layout data of integrated circuits (e.g. information stored in a GDSII (GDS2), GL1, OASIS, or any other suitable format for storing such design structures). Design structure 1690 may comprise information such as, for example, test data files, design content files, manufacturing data, layout parameters, wires, levels of metal, vias, shapes, data for routing through the manufacturing line, and any other data required by a semiconductor manufacturer to produce an embodiment of the invention as described above with reference to FIGS. 1-12. Design structure 1690 may then proceed to a stage 1695 where, for example, design structure 1690: proceeds to tape-out, is released to manufacturing, is released to a mask house, is sent to another design house, is sent back to the customer, etc.

As can now be appreciated, embodiments of the present invention provide a field effect transistor with increased drive current per unit width of device footprint. For example, in an embodiment where fingers are formed by direct lithography, with 3 fingers of a length of 100 nanometers and a spacing of 20 nanometers, and in another embodiment where fingers are formed by sidewall image transfer, with 6 fingers of a length of 50 nanometers and a spacing of 10 nanometers, there is considerable performance improvement.

Although the invention has been shown and described with respect to a certain preferred embodiment or embodiments, certain equivalent alterations and modifications will occur to others skilled in the art upon the reading and understanding of this specification and the annexed drawings. In particular regard to the various functions performed by the above described components (assemblies, devices, circuits, etc.) the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodi-

What is claimed is:

1. A field effect transistor comprising:
   a silicon substrate;
   a plurality of elongated uniaxially-strained SiGe regions disposed on the silicon substrate, wherein each elongated uniaxially-strained SiGe region of the plurality of elongated SiGe regions is spaced apart, with a portion of the silicon substrate exposed between each elongated SiGe region;
   a gate dielectric layer disposed on the plurality of elongated SiGe regions and on the portion of silicon substrate in between each elongated SiGe region; wherein the gate is oriented perpendicular to the elongated SiGe regions;
   a gate disposed on the gate dielectric layer;
   a channel region disposed below the gate, wherein electrical carriers flow through the channel region;
   a source region disposed on a first side of the gate;
   a drain region disposed on a second side of the gate;
   wherein the plurality of elongated SiGe regions are oriented in parallel to the direction of flow of electrical carriers in the channel region, and further comprising a first shallow trench isolation region disposed on a first side of the plurality of elongated uniaxially-strained SiGe regions and a second shallow trench isolation region disposed on a second side of the plurality of elongated uniaxially-strained SiGe regions.

2. The field effect transistor of claim 1, wherein a portion of the gate is disposed in between the plurality of elongated uniaxially-strained SiGe regions, and wherein no isolation region is present in between the plurality of elongated uniaxially-strained SiGe regions.

3. The field effect transistor of claim 2, wherein each of the plurality of elongated uniaxially-strained SiGe regions has a length to width ratio ranging from 10 to 40.

4. The field effect transistor of claim 1, wherein the SiGe regions have a germanium concentration ranging from about 20 atomic percent to about 40 atomic percent.

5. The field effect transistor of claim 1, wherein each elongated uniaxially-strained SiGe region has a thickness ranging from about 5 nanometers to about 25 nanometers.

6. The field effect transistor of claim 5, wherein each elongated uniaxially-strained SiGe region has a length ranging from about 0.5 micrometer to about 3 micrometers, and a width ranging from about 30 nanometers to about 80 nanometers.

7. The field effect transistor of claim 6, wherein the plurality of elongated uniaxially-strained SiGe regions have a pitch ranging from about 50 nanometers to about 100 nanometers.

8. The field effect transistor of claim 1, wherein the plurality of elongated uniaxially-strained SiGe regions comprises between three to eight regions.

9. The field effect transistor of claim 1, wherein the first shallow trench isolation region and the second shallow trench isolation region are comprised of a material selected from the group consisting of oxide, oxynitride, and nitride.

10. The field effect transistor of claim 1, further comprising a gate dielectric layer disposed below the gate, wherein the gate dielectric layer is comprised of a material selected from the group consisting of hafnium oxide, hafnium silicate, and aluminum oxide.

11. The field effect transistor of claim 1, wherein the gate is comprised of a material selected from the group consisting of aluminum, titanium nitride, tantalum nitride, tungsten, tungsten nitride, tantalum aluminum nitride, tantalum carbide, and ruthenium.

12. The field effect transistor of claim 11, wherein the gate is further comprised of polysilicon.

13. A field effect transistor comprising:
    a silicon substrate;
    a gate dielectric layer disposed on the silicon substrate;
    a gate disposed on the gate dielectric layer;
    a source region disposed on a first side of the gate;
    a drain region disposed on a second side of the gate; and
    a plurality of elongated uniaxially-strained SiGe regions disposed on the silicon substrate and oriented perpendicular to the gate, and wherein the plurality of elongated uniaxially-strained SiGe regions traverse the gate, wherein each elongated uniaxially-strained SiGe region of the plurality of elongated SiGe regions is spaced apart, with a portion of the silicon substrate exposed between each elongated SiGe region, and wherein the gate dielectric layer is in contact with the plurality of elongated uniaxially-strained SiGe regions and on the portion of silicon substrate in between each elongated SiGe region;
    a first shallow trench isolation region disposed on a first side of the plurality of elongated uniaxially-strained SiGe regions and a second shallow trench isolation region disposed on a second side of the plurality of elongated uniaxially-strained SiGe regions;
    a raised source disposed over the source region; and
    a raised drain disposed over the drain region.

14. A field effect transistor comprising:
    a silicon substrate, the silicon substrate having a first threshold voltage;
    a plurality of elongated uniaxially-strained fingers disposed on the silicon substrate, wherein each elongated uniaxially-strained SiGe region of the plurality of elongated SiGe regions is spaced apart, with a portion of the silicon substrate exposed between each elongated SiGe region, wherein the fingers have a second threshold voltage, and wherein the first threshold voltage is larger than the second threshold voltage;
    a gate dielectric layer disposed on the plurality of elongated SiGe regions and on the portion of silicon substrate in between each elongated SiGe region;
    a gate disposed on the gate dielectric layer, wherein the gate is oriented perpendicular to the fingers;
    a channel region disposed below the gate, wherein electrical carriers flow through the channel region;
    a first shallow trench isolation region disposed on a first side of the plurality of elongated uniaxially-strained SiGe regions and a second shallow trench isolation region disposed on a second side of the plurality of elongated uniaxially-strained SiGe regions;
    a source region disposed on a first side of the gate;
    a drain region disposed on a second side of the gate;
    wherein the plurality of elongated fingers are oriented in parallel to the direction of flow of electrical carriers in the channel region.

15. The field effect transistor of claim 14, wherein a portion of the gate is disposed in between the plurality of elongated uniaxially-strained fingers, and wherein no isolation region is present in between the plurality of elongated uniaxially-strained fingers.

16. The field effect transistor of claim 14, wherein each elongated uniaxially-strained finger has a length ranging from about 0.5 micrometer to about 3 micrometers, and a width ranging from about 30 nanometers to about 80 nanometers.

17. The field effect transistor of claim 14, wherein the plurality of elongated uniaxially-strained fingers have a pitch ranging from about 50 nanometers to about 100 nanometers.

18. A field effect transistor comprising:
a silicon substrate;
a gate dielectric layer disposed on the silicon substrate;
a gate disposed on the gate dielectric layer;
a source region disposed on a first side of the gate;
a drain region disposed on a second side of the gate; and
a plurality of elongated uniaxially-strained SiGe regions disposed on the silicon substrate and oriented perpendicular to the gate, and wherein the plurality of elongated uniaxially-strained SiGe regions traverse the gate, and wherein the gate dielectric layer is in contact with the plurality of elongated uniaxially-strained SiGe regions and the silicon substrate;
a first shallow trench isolation region disposed on a first side of the plurality of elongated uniaxially-strained SiGe regions and a second shallow trench isolation region disposed on a second side of the plurality of elongated uniaxially-strained SiGe regions;
a raised source disposed over the source region; and
a raised drain disposed over the drain region;
wherein the raised source and raised drain are comprised of single crystal silicon and doped with boron.

19. A method of forming a field effect transistor comprising:
forming isolation regions in a silicon substrate;
growing a SiGe layer on the silicon substrate;
forming a plurality of fingers from the SiGe layer, wherein each finger of the plurality of fingers is spaced apart, with a portion of the silicon substrate exposed between each finger;
forming a gate dielectric layer on the plurality of fingers and on the portion of the silicon substrate exposed between each finger;
forming a gate disposed on the gate dielectric layer in a perpendicular orientation to the plurality of fingers;
forming a first shallow trench isolation region disposed on a first side of the plurality of fingers; and
forming a second shallow trench isolation region disposed on a second side of the plurality of fingers.

20. The method of claim 19, wherein forming a plurality of fingers from the SiGe layer comprises removing a portion of the SiGe layer via an etch process.

21. The method of claim 20, further comprising forming a raised source and a raised drain adjacent to the gate.

22. The method of claim 19, wherein forming a plurality of fingers from the SiGe layer comprises forming fingers having a length to width ratio ranging from 10 to 40.

23. The method of claim 22, wherein forming a plurality of fingers from the SiGe layer comprises forming fingers having a pitch ranging from about 60 nanometers to about 100 nanometers.

24. The method of claim 22, wherein forming a plurality of fingers from the SiGe layer comprises forming fingers having a thickness ranging from about 5 nanometers to about 25 nanometers.

* * * * *